US010816893B2

(12) United States Patent
Wan

(10) Patent No.: US 10,816,893 B2
(45) Date of Patent: Oct. 27, 2020

(54) METHOD AND SYSTEM FOR CORRECTION OF OPTICAL PROXIMITY EFFECT

(71) Applicant: CSMC TECHNOLOGIES FAB2 CO., LTD., Wuxi New District, Jiangsu (CN)

(72) Inventor: Jinyin Wan, Jiangsu (CN)

(73) Assignee: CSMC TECHNOLOGIES FAB2 CO., LTD., Wuxi New District, Jiangsu (CN)

(*) Notice: Subject to any disclaimer, the term of this patent is extended or adjusted under 35 U.S.C. 154(b) by 0 days.

(21) Appl. No.: 16/305,308

(22) PCT Filed: May 26, 2017

(86) PCT No.: PCT/CN2017/086110
§ 371 (c)(1),
(2) Date: Nov. 28, 2018

(87) PCT Pub. No.: WO2017/206809
PCT Pub. Date: Dec. 7, 2017

(65) Prior Publication Data
US 2019/0212643 A1   Jul. 11, 2019

(30) Foreign Application Priority Data
May 31, 2016  (CN) .......................... 2016 1 0378012

(51) Int. Cl.
G06F 30/00    (2020.01)
G06F 30/20    (2020.01)
(Continued)

(52) U.S. Cl.
CPC ................ G03F 1/36 (2013.01); G06F 30/00 (2020.01); G06F 30/20 (2020.01)

(58) Field of Classification Search
CPC ........ G03F 1/36; G06F 17/50; G06F 17/5009; G06F 30/00; G06F 30/20; G06F 30/398
See application file for complete search history.

(56) References Cited

U.S. PATENT DOCUMENTS 8,762,900 B2   6/2014 Shin et al.
2010/0185998 A1* 7/2010 Wang .................. G03F 1/36
716/53
(Continued)

FOREIGN PATENT DOCUMENTS

CN        101995763 A    3/2011
CN        103513507 A    1/2014
(Continued)

OTHER PUBLICATIONS

International Search Report issued for International Patent Application No. PCT/CN2017/086110, dated Sep. 4, 2017, 6 pages including English translation.

Primary Examiner — Vuthe Siek
(74) Attorney, Agent, or Firm — Hamre, Schumann, Mueller & Larson, P.C.

(57) ABSTRACT

A method for correction of an optical proximity effect, comprising: parsing and dividing the periphery of a design pattern to obtain segments to process; for a segment having a corner comprising a segment side (101) and an adjacent side (102) forming a corner relation with the segment side, setting a target point according to the following principle: when the length of the adjacent side (102) is greater than a preset length, the target point is set at the location of the outer end point (104) of the segment side; when the length of the adjacent side (102) is less than or equal to the preset length, the target point is set between the vertex (103) of the corner and the outer end point (104) of the segment side, and the less the length of the adjacent side (102), the further the target point from the location of the outer end point (104); and adjusting, according to a simulation difference of the target point, the design pattern until it conforms to a design target.

12 Claims, 3 Drawing Sheets

(51) Int. Cl.
*G06F 30/398* (2020.01)
*G03F 1/36* (2012.01)

(56) References Cited

U.S. PATENT DOCUMENTS

2013/0246981 A1 9/2013 Chiang et al.
2015/0067619 A1 3/2015 Hsuan et al.

FOREIGN PATENT DOCUMENTS

| CN | 103885282 A | 6/2014 |
| CN | 104423178 A | 3/2015 |
| CN | 105353586 A | 2/2016 |

* cited by examiner

METHOD AND SYSTEM FOR CORRECTION OF OPTICAL PROXIMITY EFFECT

FIELD OF THE INVENTION

The present disclosure relates to a field of semiconductor technology, and particularly relates to a method and system for correction of optical proximity effect (OPE).

BACKGROUND OF THE INVENTION

With the development of semiconductor technology, the critical dimension of the key levels in the semiconductor process, such as the active region level, the gate-oxide level, or the metal wiring level, is increasingly smaller, which is approximating or even less than the wave length of the optical wave used in the photolithography technique. As such, in the photolithographic process, due to the diffraction and interference of light, certain distortion and deviation exist between the mask pattern and the photo pattern obtained on the silicon wafer actually.

Such an error in the photolithography directly affect the performance and the yield of circuits. In order to eliminate such error as much as possible, an effective way is to adopt OPE correction. A system for correction of OPE is a software system in the photolithography machine, and is computed and executed by a hardware system in the photolithography machine. The hardware system of the photolithography machine includes, for example, a CPU, a memory (including non-transitory and transitory memories), and a photolithography actuating means. The software system is stored in a non-transitory memory, when a photolithography task is carried out, the photolithography machine first reads the software system from the non-transitory memory to a transitory memory, the processor then reads it from the transitory memory and interprets it into instructions, the processor performs computation according to the instructions. All conventional corrections only set the target points at an end away from sides and corners in the segment, so as to ensure the dimensions of the pattern overall, thereby preventing cases where the lines became short or thinner. However, relatively large corner circulars may occur in sides and corners.

SUMMARY OF THE INVENTION

Accordingly, it is necessary to provide a method for correction of OPE that can improve the corner arc performance.

A method for correction of OPE includes:
parsing and dividing an outer edge of a design pattern to obtain segments to be processed;
for a segment with a corner, the corner comprises a segment side and an adjacent side forming a corner relation with the segment side, an end of the segment: side is a vertex of the corner, and the other end is an outer end point, setting up a target point according to the following principle:
when a length of the adjacent side is greater than a preset length, the target point is set up at a location of the outer end point of the segment side;
when the length of the adjacent side is less than or equal to the preset length, the target point is set up between a vertex of the side corner and the outer end point of the segment side; and the shorter the adjacent side, the farther the target point away from the outer end point; and adjusting the design pattern according to a simulation error of the target point until a simulated photolithography result of the adjusted design pattern conforms to a design target.

A system for correction of OPE includes:
a dividing module configured to parse and divide an outer edge of a design pattern to obtain segments to be processed;
a segment processing module configured to set up a target point according to a preset principle for the segment with a corner; the corner comprises a segment side and an adjacent side forming a corner relationship with the segment side, one end of the segment side is a vertex of the corner, and the other end is the outer end point; and the preset principle is:
when a length of the adjacent side is less than or equal to a preset length, the target point is set up between the vertex of the side corner and the outer end point of the segment side;
when the length of the adjacent side is greater than the preset length, the target point is set up at the outer end point of the segment side, and the shorter the adjacent side, the farther the target point away from the outer end point; and an adjustment module configured to adjust a design pattern according to a simulation error of the target point until a simulated photolithography result of the adjusted design pattern conforms to a design target.

According to the foregoing method and system, when the adjacent side is relatively short, the target point is set between the vertex of the corner and the end point of the segment side so as to effectively improve the rounding performance at the corner and, in the meanwhile, ensure the overall shape and size of the image. When the adjacent side is relatively long, the border of the pattern obtained from the simulated photolithography is relatively steep, and rounding of the corner is acceptable. As such, the overall corner rounding performance is improved.

DETAILED DESCRIPTION OF THE EMBODIMENTS

The present disclosure will be described in the following with reference to the accompanying drawings and the embodiments in order to make the above objects, features and advantages of the present disclosure more apparent.

The specific embodiments will be described in detail in combination with the accompanying drawings.

The method in the following embodiments is related to a method of how to place a target point in the OPE correction. There are a lot of steps included in the OPE correction method, and the placement of target point is one of the aspects. The embodiments below will not describe all the steps, only contents relevant to the placement of the target point are described.

Figure 1:
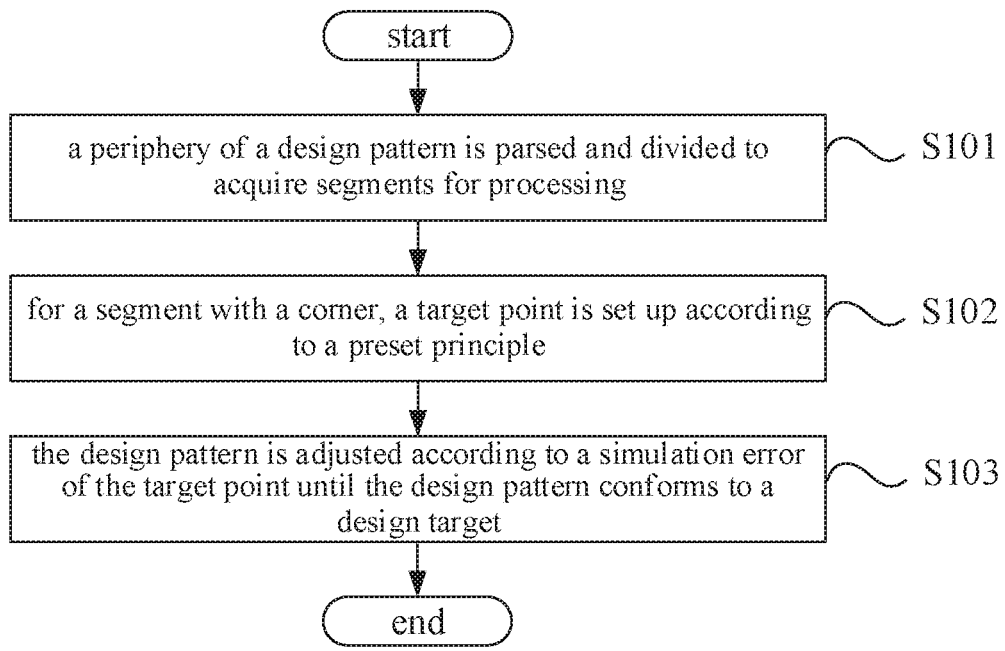
FIG. 1 is a flowchart of a method for correction of OPE according to an embodiment.

FIG. 1 is a flowchart of a method for correction of OPE according to an embodiment, the method includes the following steps of:

In step S101, an outer edge of a design pattern is parsed and divided to obtain segments to be processed. As the design pattern is usually complicated, it is necessary to divide it into several smaller segments to be processed. The segment patterns obtained after division are relatively simple and are easy to be processed. The dividing manner can include fixed length division etc.

In step S102, for a segment with a corner, a target point is set up according to a preset principle. Some of the segments, after division, are strip shaped, while others are with corners. The issue of a corner being rounded does not present in strip-shaped segments, the present embodiment is directed to the segment with a corner. For a segment with a corner, aid corner includes a segment side and an adjacent side forming a corner relation with the segment side, an end of the segment side is a vertex of the corner, and the other end is an outer end point.

A segment with the corner can either be a segment with a concave corner or a segment with a convex corner, normally a straight angle, and could be an acute angle or an obtuse angle.

Figure 2:
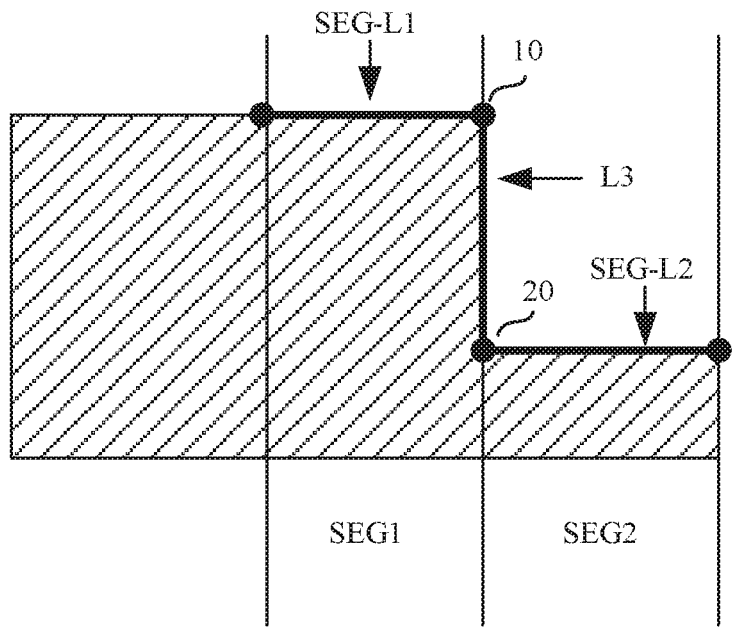
FIG. 2 illustrates a segment with a convex corner and a concave corner.

Referring to FIG. 2, a segment SEG1 has a convex corner 10, and a segment SEG2 has a concave corner 20. A segment side SEG-L1 and an adjacent side L3 of the segment SEG1 form a convex corner 10; a segment side SEG-L2 and the adjacent side L3 form a concave corner 20.

The preset principle to set up a target point is as follows:

When a length of the adjacent side is greater than a preset length, the target point is set up at an outer end point of the segment side.

When the length of the adjacent side is less than or equal to the preset length, the target point is set up between the vertex of the side corner and the outer end point of the segment side. The shorter the adjacent side, the farther the target point away from the outer end point.

In step S103, the design pattern is adjusted according to a simulation error of the target point until the design pattern conforms to a design target. After the target point is set up, the step including a simulated photolithography result can be performed, the photolithography result can be compared to the design target at the target point, then the error is calculated and the design pattern is adjusted according to the error. The process is then looped till the simulated photolithography result conforms to the design target, that is, there is no error between the photolithography result at the target point and the design target.

In the foregoing method, the arc performance at the corner can be improved by adaptively selecting the placing location of the target point according to the length of the adjacent side.

Step S102 will be described in detail with a segment that has a concave corner.

Figure 3A:
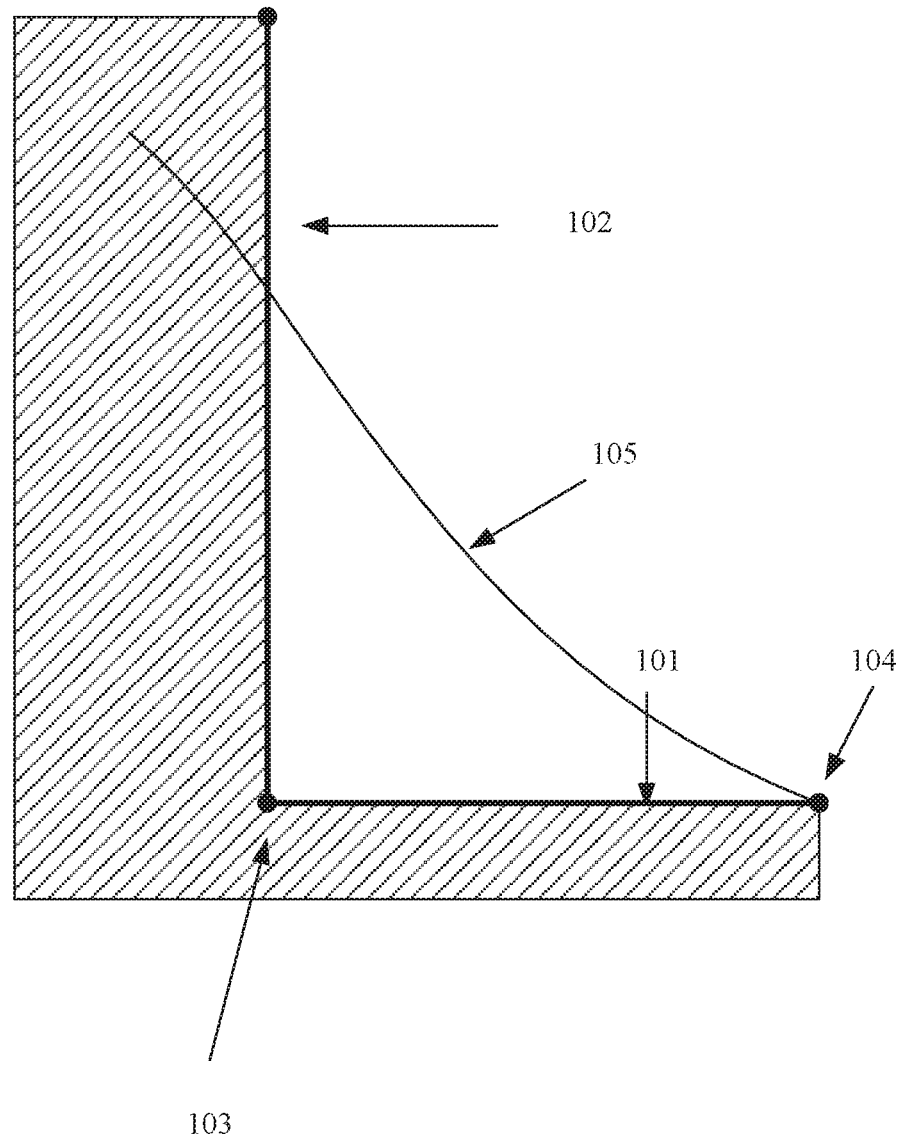
FIG. 3a shows a case of a placement of a target point when the adjacent side are relatively long.

As shown in FIG. 3a, a concave corner is formed by a segment side 101 and an adjacent side 102. When the adjacent side is relatively long, i.e., the adjacent side is greater than a preset length, the border 105 of the simulated photolithography pattern usually will have a steep slope. Then, the target point will be placed at the outer end point 104 of the segment, for one thing, a correction error at the target point can be avoided, so that there will be no variance of overall shape and size to the photolithography pattern of the entire segment; for another thing, as there is a relatively steep slope of the border 105, the rounding performance at the corner will not be too poor.

Figure 3B:
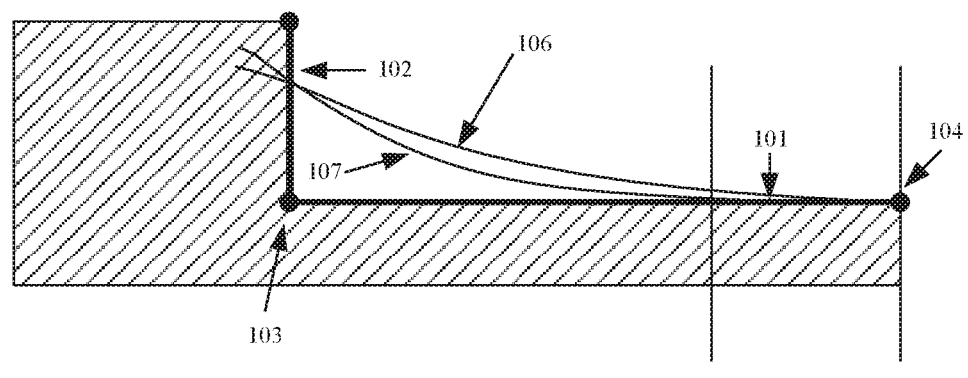
FIG. 3b shows a case of a placement of target points when adjacent sides are relatively short.

As shown in FIG. 3b, a concave corner is formed by a segment side 101 and an adjacent side 102. When the adjacent side is relatively short, i.e., the adjacent side is less than the preset length, if the target point is continued to be set at the outer end point 104 of the segment, the border 106 of the simulated photolithography pattern will have a relatively gentle slope. Then the arc at the corner will be relatively large, and the round performance at the corner will be too poor.

Accordingly, in the present embodiment, when the adjacent side is relatively short, the target point will be set between the outer end point 104 and the vertex 103 of the corner, such as point P shown in FIG. 3b. When the variance based on the target point is corrected, a border 107 of the simulated photolithography pattern is obtained. It can be saw that, border 107 has a better corner performance than border 106, while there is hardly any variance of the correction at the outer end point 104.

As such, when the adjacent side is relatively short, the target point is set between the outer end point 104 and the vertex 103 of the corner, so as to effectively ameliorate the rounding performance at the corner, while ensure overall shape and size of the pattern.

The setting of the target point of a segment with a convex corner is similar to the foregoing. It can be understood that with respect to cases the corner is a non-straight corner, the target point can be set with reference to the foregoing method.

When the adjacent length is less than the preset length, the target point is set between the vertex of the corner and the end point of the segment, so as to effectively ameliorate the extent of rounding of the corner. The preset length is usually set up to be a minimal value of the design rule.

Further, as the length of the adjacent side is shorter and shorter within a range under the preset length, the target point can be moved in a direction getting closer to the vertex of the corner (or away from the outer end point of the segment). In a particular embodiment, for the length X of the adjacent side, the length L of the segment side and the preset length N, the length Y of the target point away from the vertex of the corner is determined according to the following formula: $Y=X*(L/N)$. $X \leq N$, which means the length of the corresponding adjacent side is less than the preset length.

When $X=N$, then $Y=L$, i.e., the length of the target point away from the vertex of the corner is equal to the length of the segment, and the target point is located at the outer end point of the segment. When $X<N$, then $Y<L$, i.e., the target point is located between the vertex of the corner and the outer end point of the segment. As the length X of the adjacent side reduces, the length Y also reduces, i.e., the target point is getting closer to the vertex of the corner.

In other embodiments, other function relation that is in line with the variation trend can also be adopted, it is not limited to the above.

Figure 4:
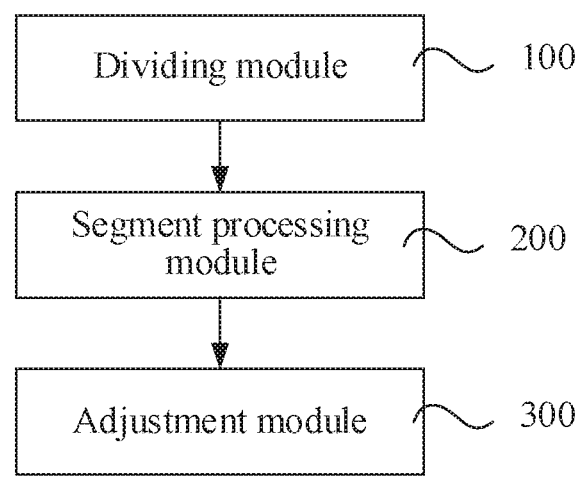
FIG. 4 is a block diagram of a system for correction of OPE according to an embodiment.

Accordingly, a system for correction of OPE is also provided. The system in the following embodiment is related to a system of the placement of the target points in the OPE correction, there are a lot of modules included in the OPE correction, and the placement of target points is one of the aspects. The embodiments below will not list or describe all the modules, only contents relevant to the placement of the target points are described. The processor can complete processes such as pattern division, segment processing, target point position calculation and adjustment etc. according to the instruction computing. The result of the processing can be feedback to the photolithography executing means for particular execution. As shown in FIG. 4, the system includes a dividing module 100, a segment processing module 200 and an adjustment module 300. The foregoing modules are functional modules in a software system, which are corresponding to a functional architecture of the software. The particular processing is computed and processed by the CPU.

A dividing module 100 configured to parse and divide an outer edge of a design pattern to obtain segments to be processed.

A segment processing module 200 configured to, for a segment with a corner, set up a target point according to a preset principle. Where, the corner includes a segment side and an adjacent side forming a corner relationship with the segment side, an end of the segment is the vertex of the corner, the other end is the outer end point; the preset principle is: when a length of the adjacent side is greater than a preset length, the target point is set up at an outer end point of the segment side, when the length of the adjacent side is less than or equal to the preset length, the target point is set up between the vertex of the side corner and the outer end point of the segment side; the shorter the adjacent side, the farther the target point away from the outer end point.

An adjustment module 300 configured to adjust the design pattern according to a simulation error of the target point until the design pattern conforms to a design target.

Where the dividing module 100 divides the complex design pattern into several small segments to be processed. The segment patterns obtained after division are relatively simple and are easy to be processed. The dividing manner can include fixed length division etc.

The particular processing by the segment processing module 200 mainly includes the target point placement, reference can be made to the foregoing method for correction of OPE for the particular placing.

The adjustment module 300, after the target point is set up by the segment processing module 200, can perform including a simulated photolithography result, comparing the photolithography result to the design target at the target point, and then adjusting the design pattern is adjusted according to the error. The process is then looped till the simulated photolithography result conforms to the design target. The obtained pattern can be used for a mask.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. A correction method for optical proximity effect (OPE), comprising:
   parsing and dividing an outer edge of a design pattern to obtain segments to be processed; wherein, for a segment with a corner, the corner comprises a segment side and an adjacent side forming a corner relation with the segment side, an end of the segment side is a vertex of the corner, and the other end is an outer end point,
   setting up a target point according to the following principle:
   when a length of the adjacent side is greater than a preset length, the target point is set up at a location of the outer end point of the segment side;
   when the length of the adjacent side is less than or equal to the preset length, the target point is set up between a vertex of the side corner and the outer end point of the segment side; and the shorter the adjacent side, the farther the target point away from the outer end point; and
   adjusting the design pattern according to a simulation error of the target point until a simulated photolithography result of the adjusted design pattern conforms to a design target,
   wherein the step of adjusting the design pattern according to the simulation error of the target point until the simulated photolithography result of the adjusted design pattern conforms to the design target comprises:
   simulating photolithography after the target point is set up and obtaining a simulated photolithography result at the target point;
   comparing simulated photolithography result at the target point to the design target at the target point, and calculating an error;
   adjusting the design pattern according to the error; and
   repeating the steps of simulating photolithography, calculating the error, and adjusting the design pattern, until there is no error between the simulated photolithography result and the design target at the target point.

2. The method of claim 1, wherein the corner is a concave corner or a convex corner.

3. The method of claim 1, wherein the corner is an acute angle, a straight angle, or an obtuse angle.

4. The method of claim 1, wherein the preset length is a minimal size of a design rule.

5. The method of claim 1, wherein in the step of parsing and dividing the outer edge of the design pattern to obtain segments to be processed, a fixed length division is adopted.

6. A correction method for optical proximity effect (OPE), comprising:
   parsing and dividing an outer edge of a design pattern to obtain segments to be processed; wherein, for a segment with a corner, the corner comprises a segment side and an adjacent side forming a corner relation with the segment side, an end of the segment side is a vertex of the corner, and the other end is an outer end point,
   setting up a target point according to the following principle:
   when a length of the adjacent side is greater than a preset length, the target point is set up at a location of the outer end point of the segment side;
   when the length of the adjacent side is less than or equal to the preset length, the target point is set up between a vertex of the side corner and the outer end point of the segment side;
   and the shorter the adjacent side, the farther the target point away from the outer end point and adjusting the design pattern according to a simulation error of the target point until a simulated photolithography result of the adjusted design pattern conforms to a design target,
   , wherein for a length X of the adjacent side, a length L of the segment side and a preset length N, the length Y of the target point away from the vertex of the corner is determined according to the following formula: $Y=X*(L/N)$.

7. A system for correction of OPE, comprising:
   a dividing module configured to parse and divide an outer edge of a design pattern to obtain segments to be processed;
   a segment processing module configured to set up a target point according to a preset principle for the segment with a corner; wherein the corner comprises a segment side and an adjacent side forming a corner relationship with the segment side, one end of the segment side is a vertex of the corner, and the other end is the outer end point; and the preset principle is: when a length of the adjacent side is less than or equal to a preset length, the target point is set up between the vertex of the side corner and the outer end point of the segment side; when the length of the adjacent side is greater than the preset length, the target point is set up at the outer end point of the segment side, and the shorter the adjacent side, the farther the target point away from the outer end point; and an adjustment module configured to adjust a design pattern according to a simulation error of the target point until a simulated photolithography result of the adjusted design pattern conforms to a design target, wherein the adjustment module is configured to:

perform a simulated photolithography after the target point is set and obtain a simulated photolithography result at the target point;

compare the simulated photolithography result at the target point to the design target at the target point, and calculate the error;

adjust the design pattern according to the error; and repeat the steps of simulating photolithography, calculating the error, and adjusting the design pattern, until there is no error between the simulated photolithography result at the target point and the design target.

8. The system of claim 7, wherein the corner is a concave corner or a convex corner.

9. The system of claim 7, wherein the corner is an acute angle, a straight angle, or an obtuse angle.

10. The system of claim 7, wherein the preset length is a minimal size of a design rule.

11. The system of claim 7, wherein, the dividing module adopts a fixed length division in parsing and dividing.

12. A system for correction of OPE, comprising:

a dividing module configured to parse and divide an outer edge of a design pattern to obtain segments to be processed;

a segment processing module configured to set up a target point according to a preset principle for the segment with a corner; wherein the corner comprises a segment side and an adjacent side forming a corner relationship with the segment side, one end of the segment side is a vertex of the corner, and the other end is the outer end point and the preset principle is: when a length of the adjacent side is less than or equal to a preset length, the target point is set up between the vertex of the side corner and the outer end point of the segment side; when the length of the adjacent side is greater than the preset length, the target point is set up at the outer end point of the segment side, and the shorter the adjacent side, the farther the target point away from the outer end point; and an adjustment module configured to adjust a design pattern according to a simulation error of the target point until a simulated photolithography result of the adjusted design pattern conforms to a design target, wherein, when the segment processing module is determining the location of the target point, for a length X of the adjacent side, a length L of the segment side and a preset length N, the length Y of the target point away from the vertex of the corner is determined according to the following formula: $Y=X*(L/N)$.

* * * * *